United States Patent [19]

Crilly, Jr. et al.

[11] Patent Number: 5,133,083
[45] Date of Patent: Jul. 21, 1992

[54] ADJACENT CHANNEL SELECTIVITY SIGNAL GENERATOR SYSTEM

[75] Inventors: William J. Crilly, Jr., Liberty Lake, Wash.; Earl C. Herleikson, Yamhill, Oreg.

[73] Assignee: Hewlett-Packard Company, Palo Alto, Calif.

[21] Appl. No.: 464,466

[22] Filed: Jan. 12, 1990

[51] Int. Cl.$^5$ .................... H04B 17/00; H04B 1/00
[52] U.S. Cl. .................... 455/45; 455/67.1; 455/226.1; 324/624
[58] Field of Search ............ 455/62, 63, 67, 102, 455/103, 104, 226, 296, 45, 266; 324/619, 624, 636

[56] References Cited

U.S. PATENT DOCUMENTS

| | | | |
|---|---|---|---|
| 2,988,693 | 6/1961 | Billig et al. | 455/226 |
| 4,019,140 | 4/1977 | Swerdlow | 455/63 |
| 4,068,176 | 1/1978 | Metaggert | 455/226 |
| 4,245,352 | 1/1981 | Karpowycz et al. | 455/226 |
| 4,811,395 | 3/1989 | Cleary, Jr. et al. | 324/619 |
| 4,918,684 | 4/1990 | Boschet et al. | 370/17 |

OTHER PUBLICATIONS

Hewlett Packard, "AM-FM Signal Generators Model 8640B," pp. 3-4 (fold-out) and p. 13, Technical Data, Jun. 1984.
Hewlett Packard, "Synthesized Signal Generators Model 8642A, Model 8642B," 100 kHz to 2115 MHz, p. 8, Technical Data, Sep. 1985.
Hewlett Packard HP8645A, "Agile Signal Generator 252 kHz to 2060 MHz, Combining Frequency Agility with High Performance," Technical Data, Jan., 1988.
Hewlett Packard, "Synthesized Signal Generator Model 8662A", 10 kHz to 1280 MHz, Technical Data 1, Mar, 1984.
"EIA Standard RS-204-C, Minimum Standards for Land Mobile Communication FM or PM Receivers, 25-947 MHz," Electronic Industries Association, Jan., 1982, pp. 14-15.

*Primary Examiner*—Curtis Kuntz
*Assistant Examiner*—Lisa Charouel

[57] ABSTRACT

In an adjacent channel measurement system, a desired channel signal and an adjacent channel signal are generated using a single signal generator. The output from this generator is modulated with a signal from an offset oscillator to produce a carrier and a sideband signal, one in each channel. The ratio of the carrier amplitude to the sideband amplitude is set by the system's modulation index, which is controlled by an audio attenuator on the output of the offset oscillator.

33 Claims, 2 Drawing Sheets

ADJACENT CHANNEL SELECTIVITY SIGNAL GENERATOR SYSTEM

FIELD OF THE INVENTION

The present invention relates to radio frequency (RF) signal generators, and more particularly relates to RF signal generators used in performing adjacent channel selectivity measurements on radio receivers.

BACKGROUND AND SUMMARY OF THE INVENTION

Adjacent channel selectivity is a measurement of a radio receiver's ability to receive a desired signal on a first channel in the presence of a much stronger signal on an adjacent, second channel. To perform this measurement, two signal generators are used: a first generator tuned to the desired channel and modulated with a first tone, and a second generator tuned to the adjacent channel and modulated with a second tone.

In an exemplary measurement methodology, the first signal generator's output level is adjusted to provide a specified SINAD measurement in the receiver under test (typically 12 dB). The second generator's output level is then increased until this SINAD measurement is degraded a specified amount (typically 6 dB). The output signal levels of the two generators are then compared and their ratio converted into logarithmic form to yield an adjacent channel selectivity measurement expressed in decibels.

A related procedure is termed "compliance testing" and involves setting the amplitude of the in-and out-of channel signals at known, fixed values and confirming that the resulting SINAD measurement is below a given value.

The adjacent channel selectivity measurement procedure has a number of drawbacks that, for years, have been suffered rather than cured. A principal drawback is that the measurement accuracy depends on the accuracy with which the amplitudes of the signals produced by the two generators can be determined. These amplitudes are typically determined by reference to calibrations on RF step attenuators used in each generator to attenuate its nominal output level down to the desired value. While attenuators can be well characterized at audio frequencies, radio frequency attenuators unavoidably have non-flat frequency responses due to stray reactances. The inaccuracies of such attenuators become particularly acute at high frequencies. (Some signal generators span frequencies extending into the gigahertz range.) Thus, it is difficult to accurately ascertain the ratio of amplitudes of the two signals used in making the adjacent channel selectivity measurement.

A related problem is that of matching the nominal output level of the two generators. The nominal output level (the level from which the attenuators attenuate) is set in each generator by automatic level control circuitry. While such circuitry is effective to eliminate variations in levels over time, there is typically no provision for sharing a reference level between two generators so that both outputs can be set to precisely the same level. Absent a shared reference level, component tolerances in the reference circuits introduce additional uncertainties into the adjacent channel selectivity measurement.

An additional drawback to the prior art measurement procedure is the requirement for two signal generators.

In accordance with the present invention, these drawbacks of the prior art are overcome by generating the desired channel signal and the adjacent channel signal using a single signal generator. The output from this generator is modulated with a signal from an offset oscillator to produce a carrier and a sideband signal, one in each channel. The ratio of the carrier amplitude to the sideband amplitude is set by the system's modulation index, which is controlled by an audio attenuator on the output of the offset oscillator.

The foregoing and additional features and advantages of the present invention will be more readily apparent from the following detailed description, which proceeds with reference to the accompanying drawings.

DETAILED DESCRIPTION

Figure 1:
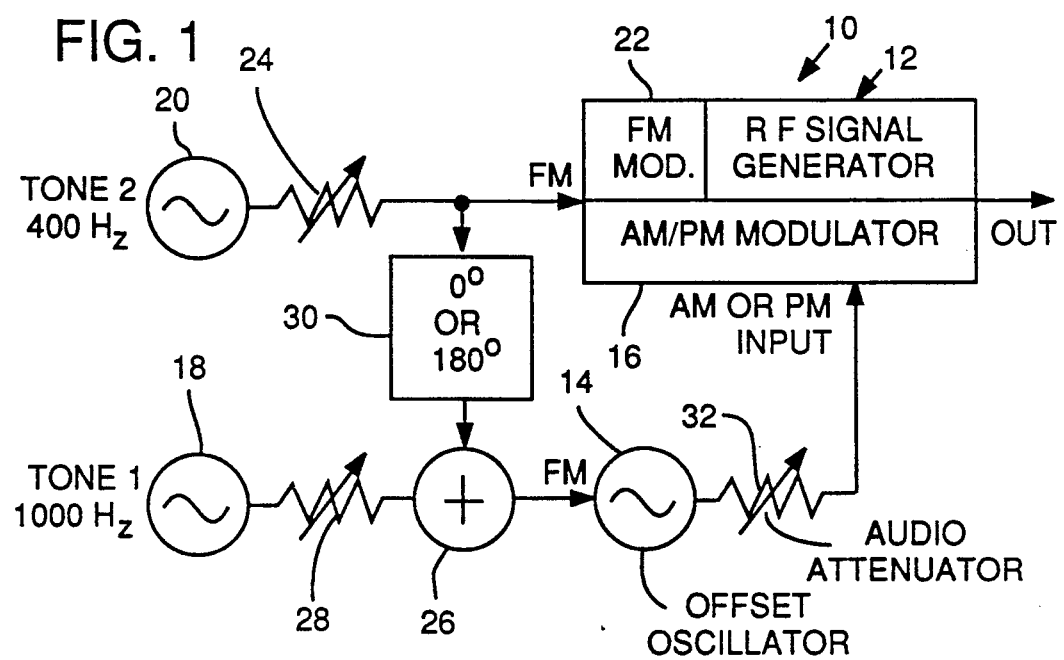
FIG. 1 is a schematic block diagram of a first embodiment of the present invention in which a signal generator is amplitude modulated by an offset signal to produce sideband signals.

Referring first to FIG. 1, a first system 10 according to the present invention includes a RF signal generator 12 and a offset signal oscillator 14. The RF signal generator 12 produces an RF signal at, in the illustrated embodiment, the frequency of the adjacent channel. The offset signal oscillator produces a signal at a difference frequency that separates the desired channel from the adjacent channel.

Figure 2:
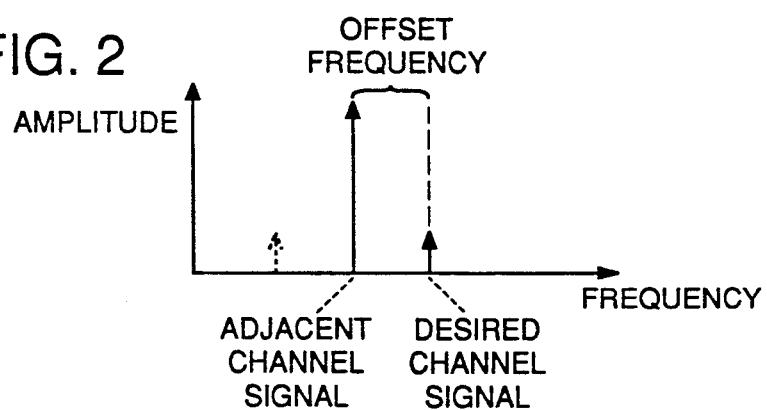
FIG. 2 is a diagram illustrating the relationship between the desired channel signal and the adjacent channel signal.

The RF signal generator 12 includes an AM modulator 16 which is used to modulate the RF signal with the offset signal. The resulting output signal includes a carrier component at the frequency of the RF signal (i.e. at the frequency of the adjacent channel), plus sidebands spaced symmetrically from the carrier by an amount equal to the offset frequency. One of the sidebands thus falls at the frequency of the desired channel. This relationship is illustrated by FIG. 2.

(The signal at the desired channel is sometimes referred to as the "first" or "sideband" RF signal, and the signal at the adjacent channel is sometimes referred to as the "second" or "carrier" RF signal.)

The typical measurement protocol requires that each of these two signals be modulated with audio tones. The first RF signal is usually modulated with a 1000 hertz tone (the "first" tone) and the second RF signal is modulated with a 400 hertz tone (the "second" tone). The system 10 thus must provide some mechanism for modulating the first and second RF signals with the corresponding tones. Since the first RF signal is generated as a sideband of the second (carrier) RF signal, however, any modulation present on the carrier signal will also appear in the sideband signal. In the preferred embodiment, this is overcome by use of a circuit arrangement in which audio modulation present on the carrier is cancelled from one of the sidebands.

Referring again to FIG. 1, two tone generators 18, 20 provide the first and second tone signals. The second tone signal is applied to an FM modulator section 22 of the RF signal generator 12 and provides a 400 hertz modulation of the resulting carrier signal. (The deviation of this modulation is set by a resistor 24 in accordance with requirements of the receiver being measured. In an exemplary embodiment the deviation may be set to 10 kilohertz.) The first and second tone signals are combined by a summer 26 and applied to an FM input port of the offset oscillator 14. The resulting modulated offset signal, hereafter termed the "subcarrier" signal, includes modulation components at both 400 and 1000 hertz. (The deviation of this modulation is controlled by the combined operation of the above-noted resistor 24 [for the 400 hertz tone] and a resistor 28 [for the 1000 hertz tone] and may again be set to yield a 10 kilohertz deviation in the resulting subcarrier signal.)

The 400 hertz modulation of the RF signal generator 12 would normally be present on the sidebands produced by the modulator 16. However, in this circuit arrangement it is not because the summed signal includes this same 400 hertz tone and it is used to provide corresponding modulation of the offset oscillator 14. The modulation of the offset signal with a summed signal that includes this 400 hertz tone cooperates with the modulation of the RF generator signal by the same 400 hertz tone to cancel this tone from one of the resulting sideband signals. (The 400 hertz tones add, rather than cancel, in the other sideband. The selection of which sideband has the cancelling tones can be made by a circuit 30 that selectably inverts the 400 hertz tone provided to the summer 26.) The final result is that the first RF signal (the sideband signal) is left only with 1000 hertz tone modulation and the second RF signal (the carrier signal) has only 400 hertz tone modulation.

The ratio of the second RF signal to the first depends on the modulation index of the amplitude modulation. If the modulation index is 100 percent, the ratio between the power in the carrier and the power in each sideband is 6 dB. Lower modulation indices yield proportionately higher ratios. In the illustrated embodiment, the modulation index is set by an audio attenuator 32 that controls the subcarrier level provided to the AM modulator 16. The modulation index is usually set to be quite small in order to achieve a ratio of 40-100 dB between the desired and adjacent channel signals, depending on the characteristics of the receiver being measured.

Figure 3:
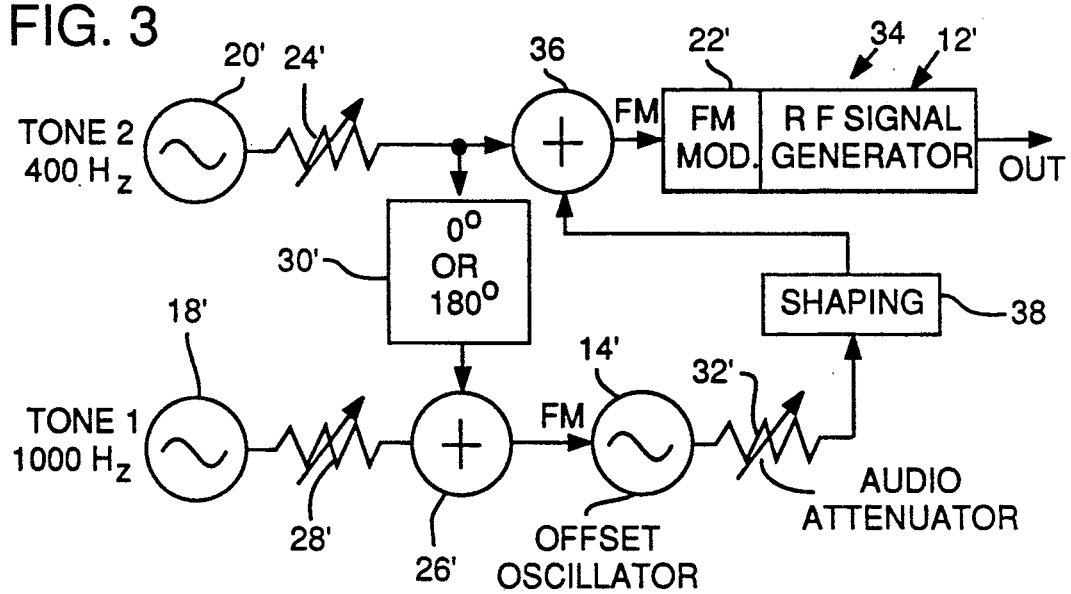
FIG. 3 is a schematic block diagram of a second embodiment of the present invention in which a signal generator is frequency modulated with an offset signal to produce sideband signals.

As noted in FIG. 1, an alternative embodiment may be constructed to produce the sideband signal by phase modulating the RF signal generator 12 with the subcarrier signal, rather than by amplitude modulating. The same principles still operate to cancel the undesired 400 hertz modulation from the first, sideband signal, and the sidebands are still spaced from the carrier by the offset frequency FIG. 3 shows a second system 34 according to the present invention that is similar in many respects to the first system 10. Again, a 400 hertz tone from a tone generator 20' is used to frequency modulate an RF signal generator 12'. Again, the 400 and 1000 hertz signal from the tone generators 18', 20' are applied to a summer 26' and the resulting summed signal is applied to the FM input of an offset oscillator 14'. In this embodiment, however, the subcarrier signal produced by modulation of the offset oscillator 14' is used to frequency modulate, rather than amplitude or phase modulate, the RF signal generator 12'. Since the RF generator 12' is to be frequency modulated by both the second tone and by the subcarrier, these signals are here combined in a second summer 36, yielding a combined subcarrier signal which is applied to an FM modulator portion 22' of the signal generator 12'.

Again, in order to achieve a ratio of 40-100 dB between the first and second signals, a very small modulation index is used. The small modulation index yields a narrow band FM (NBFM) signal, which provides advantageous sideband characteristics, as noted below in connection with a third embodiment.

Frequency modulation of the RF signal generator 12' with the modulated output signal from the offset oscillator 14' (the subcarrier signal) yields an anomaly. The anomaly is that the amplitude of the sidebands produced by frequency modulation fall off with frequency either side of the carrier. Since the subcarrier signal (which is translated up to form the sideband signal) is modulated, it has a non-zero bandwidth. Its frequency components nearer the carrier thus have a greater amplitude than its frequency components further away from the carrier. This asymmetry interferes with proper cancellation of the 400 hertz tone from the sideband signal.

To correct the anomaly, the preferred embodiment provides shaping circuitry 38 between the offset oscillator and the summer 36 which precompensates for the frequency rolloff naturally provided by the FM spectrum. To be effective, this shaping should emphasize the high frequency modulation components and deemphasize the low frequency modulation components. This function can be advantageously performed by a differentiating element, such as a capacitor. This differentiation function performed on the subcarrier signal may be conceptualized as changing it from a frequency modulated signal to a phase modulated signal, since frequency is the derivative of phase. This shaping corrects the asymmetry of the sideband and permits good cancellation of the 400 hertz tone component.

All of the foregoing embodiments produce two sidebands, symmetrically spaced about the carrier. However, only one sideband is needed to provide the desired channel signal to the receiver under test. In some rare instances the second sideband may interfere with the measurement. To eliminate the other sideband, the system 40 of FIG. 4 may be used.

Figure 4:
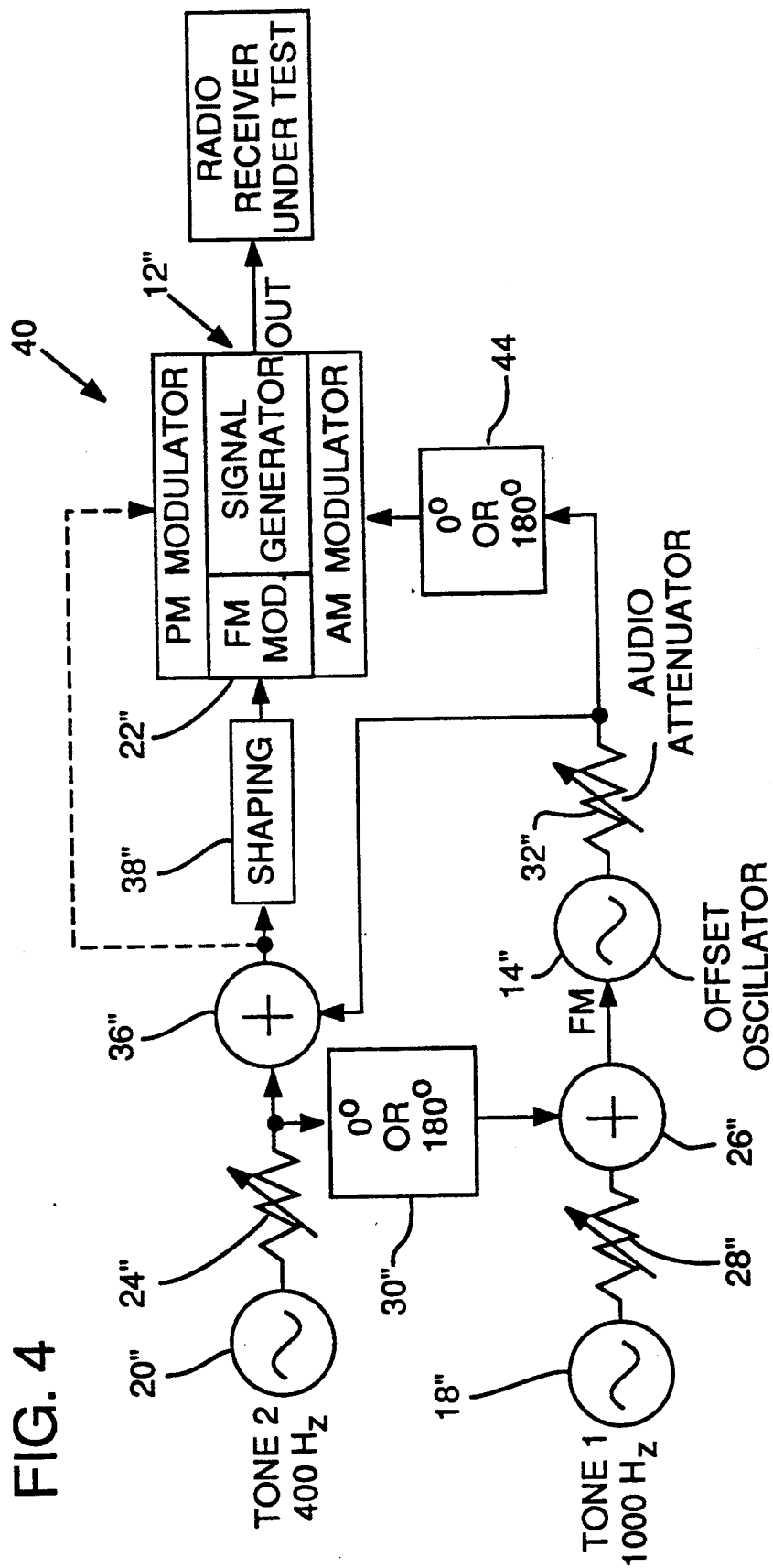
FIG. 4 is a schematic block diagram of a third embodiment of the present invention illustrating that an offset signal may both AM and FM a signal generator so as to produce a substantially single sideband output signal.

In the FIG. 4 system 40, the RF signal generator 12'' is doubly modulated with the subcarrier: once with AM and once with either narrow band FM or PM. Each modulation produces a pair of sidebands. If the modulation indices of both are set to be equal, the sidebands will cancel on one side of the carrier and will add on the other side of the carrier.

This is most clearly seen in the case of modulating with both FM and AM. The phasor representations of the FM and AM signals (assuming the FM is narrow band FM) are as follows:

$$\phi_{NBFM}(t) = Ae^{j\omega c t}(1 + \tfrac{1}{2}\beta e^{j\omega m t} - \tfrac{1}{2}\beta e^{-j\omega m t}) \quad (1)$$

$$\phi_{AM}(t) = Ae^{j\omega c t}(1 + \tfrac{1}{2}me^{j\omega m t} + \tfrac{1}{2}me^{-j\omega m t}) \quad (2)$$

where: $\beta$ is the FM index of modulation,
m is the AM index of modulation,
$\omega c$ is the frequency of the carrier signal, and
$\omega m$ is the frequency of the modulation signal.

It will be recognized that the three parenthetical terms in each expression represent the carrier, the upper sideband, and the lower sideband, respectively. When summed, the two lower sideband terms cancel (provided β=m), leaving just the carrier and upper sideband components.

If is desired to cancel the upper sideband, the phase of the AM modulation input 42 can be inverted by a circuit 44. This circuit may be controlled in tandem with the other phase control circuit 30" so that the sideband that remains is the sideband from which the 400 Hertz tone modulation has been cancelled.

Again, like the FIG. 3 system 34, the subcarrier signal is combined with the 400 hertz tone signal from the second tone oscillator 20" so that the RF signal generator 12 is frequency modulated both by the subcarrier signal and by the 400 hertz tone signal. Again, a shaping circuit 38 is used to compensate for the frequency rolloff in the subcarrier sideband.

From the foregoing, it will be recognized that the present invention overcomes the disadvantages of the prior art. A single signal generator is used, reducing cost and obviating the need to reference the output level of one signal generator to that of another. More importantly, the prior art use of RF attenuators is eliminated. The present invention substitutes in their stead a single audio attenuator whose characteristics can be precisely quantified, permitting highly accurate measurement up into the gigahertz range.

Having described and illustrated the principles of our invention with reference to several embodiments thereof, it will be apparent that the invention can be modified in arrangement and detail without departing from such principles. For example, while the invention has been illustrated with reference to a system in which the RF signal generator is tuned to serve as the adjacent channel signal and its sideband serves as the desired channel signal, in other embodiments, the signal generator may be tuned to serve as the desired channel signal and a sideband used as the adjacent channel signal. (In this case, the carrier signal would need to be greatly attenuated to achieve the desired signal ratio. This may be accomplished by amplitude modulation using a multiplier, which yields a double sideband suppressed carrier signal, and then controllably reinjecting a small amplitude carrier signal).

Similarly, while the invention has been illustrated with reference to a system in which an unwanted sideband is cancelled by a particular combination of AM and FM modulation, in other embodiments, other techniques may of course be used. For example, the RF signal generator may be frequency modulated with the second tone, may be phase modulated with the subcarrier (prior to its summation with the second tone), and may be amplitude modulated with the subcarrier after its summation with the second tone. Numerous other variations can readily be devised by those of ordinary skill in the art.

Still further, an unwanted sideband may be removed by other techniques, such as by notch filtering and by other phase cancellation schemes.

Yet further, those of ordinary skill in the art will readily recognize that frequency and phase modulation may often be interchanged in the illustrated embodiments.

Finally, it should be recognized that nonsinusoidal baseband modulation sources may be used instead of the sinusoidal tone sources illustrated. One such nonsinusoidal source may produce waveforms used to generate Gaussian Minimum Shift Keying (GMSK). There are many applications in which FM signal generators are used to simulate digitally modulated sources. The principles of the present invention can be advantageously used in such generators.

In view of the variety of other embodiments to which the principles of our invention may be applied, it should be recognized that the detailed embodiments are illustrative only and should not be taken as limiting the scope of our invention. Rather, we claim as our invention all such embodiments as may come within the scope and spirit of the following claims and equivalents thereto.

We claim:
1. In a method of measuring or compliance testing for adjacent channel selectivity in a radio receiver including the steps:
   tuning the radio receiver to a first RF frequency;
   providing the receiver a first RF signal at said first RF frequency;
   providing the receiver a second RF signal at a second RF frequency adjacent the first RF frequency;
   relating the amplitude of the first RF signal to the second RF signal; and
   measuring the receiver signal-to-noise ratio;
   an improvement comprising generating the first and second RF signal with a single signal generator by generating a signal at one of said first or second RF frequencies and modulating said signal with a subcarrier to produce a sideband at the other of said first or second RF frequencies.

2. The method of claim 1 in which the modulating comprises amplitude modulating.

3. The method of claim 1 in which the modulating comprises frequency modulating.

4. The method of claim 1 in which the modulating comprises phase modulating.

5. The method of claim 1 in which the modulating comprises both amplitude modulating and one of either frequency or phase modulating.

6. The method of claim 1 which includes:
   providing the first RF signal with frequency modulation of a first baseband modulation signal; nd
   providing the second RF signal with frequency modulation of a second baseband modulation signal different than the first baseband modulation signal.

7. The method of claim 6 which includes:
   frequency modulating the second RF signal with the second baseband modulation signal;
   summing the first and second baseband modulation signals;
   frequency modulating an offset signal with said summed modulation signals to produce the subcarrier;
   controlling the level of the subcarrier; and
   modulating the second RF signal with the subcarrier;
   wherein the modulation of the offset signal with the summed modulation signal that includes the second baseband modulation signal, cooperates with the modulation of the second RF signal by the second baseband modulation signal to cancel the second baseband modulation signal from the first RF signal, leaving the first RF signal modulated with just the first baseband modulation signal.

8. The method of claim 7 which further includes cancelling one of two sidebands produced by modulating the second RF signal.

9. The method of claim 7 which further includes controlling the phase of the frequency modulation by the second baseband modulation signal on the offset signal to control from which of two sidebands the second baseband modulation signal is cancelled.

10. The method of claim 7 in which said modulating the second RF signal with the subcarrier comprises phase modulating the second RF signal with the subcarrier.

11. The method of claim 7 in which said modulating the second RF signal with the subcarrier comprises amplitude modulating the second RF signal with the subcarrier.

12. The method of claim 6 which includes:
   summing the first and second baseband modulation signals;
   frequency modulating an offset signal with said summed modulation signals to produce the subcarrier;
   controlling the level of the subcarrier; and
   frequency modulating the second RF signal with both the subcarrier signal and the second baseband modulation signal.

13. The method of claim 12 in which the frequency modulating step comprises:
   combining the subcarrier with the second baseband modulation signal to produce a combined subcarrier signal; and
   frequency modulating the second RF signal with the combined subcarrier signal.

14. The method of claim 12 which further includes shaping the subcarrier signal.

15. The method of claim 14 in which shaping the subcarrier signal includes differentiating the subcarrier signal.

16. An apparatus useful in measuring adjacent channel selectivity of a radio receiver under test comprising:
   an RF signal generator for producing an RF signal;
   an offset signal generator for producing an offset signal;
   first modulation means for modulating the RF signal with the offset signal to produce first and second RF signals, one of said first or second RF signals being a sideband of the other;
   means for generating first and second different baseband modulation signals;
   second modulation means for modulating the first RF signal with the first baseband modulation signal;
   third modulation means for modulating the second RF signal with the second baseband modulation signal; and
   means for providing a single composite signal, comprising both the first RF signal modulated with the first baseband modulation signal, and the second RF signal modulated with the second baseband modulation signal, to the radio receiver under test.

17. The apparatus of claim 16 which further includes:
   first combining means for combining the first and second baseband modulation signals to produce a combined modulation signal;
   and in which the second modulation means includes fourth modulation means for modulating the offset signal with the combined modulation signal to produce a modulated offset signal; wherein the modulation of the offset signal with said combined signal cooperates with the modulation of the second RF signal with the second baseband modulation signal, to cancel the second baseband modulation signal from the first RF signal, leaving the first RF signal modulated with just the first baseband modulation signal.

18. The apparatus of claim 17 in which:
   the RF signal generator produces the second RF signal;
   the first modulation means comprises means for modulating the second RF signal with said offset signal;
   the third modulation means comprises means for frequency modulating the second RF signal with the second baseband modulation signal; and
   the fourth modulation means comprises means for frequency modulating the offset signal with the combined modulation signal.

19. The apparatus of claim 18 which further comprises:
   second combining means for combining the modulated offset signal with the second baseband modulation signal to produce a combined offset signal;
   and in which the first, second and third modulation means comprise means for frequency modulating the second RF signal from the RF signal generator with the combined offset signal.

20. The apparatus of claim 18 which further comprises:
   means for controlling a modulation index of the modulation of the second RF signal by said offset signal to adjustably control the amplitude of the first RF signal.

21. The apparatus of claim 20 in which the first modulation means comprises means for amplitude modulating the second RF signal with said offset signal.

22. The apparatus of claim 20 in which the first modulation means comprises means for phase modulating the second RF signal with said offset signal.

23. A method of generating first and second RF signals used in measuring adjacent channel selectivity of a receiver under test, the method comprising the steps:
   generating first and second baseband modulation signals;
   summing said baseband modulation signals to produce a summed modulation signal;
   producing an offset signal;
   frequency modulating said offset signal with the summed modulation signal to yield a subcarrier signal;
   controlling the level of the subcarrier signal;
   producing an RF signal; and
   amplitude modulating said RF signal with the subcarrier signal and additionally modulating said RF signal with both the subcarrier signal and the second baseband modulation signal using a form of modulation other than amplitude modulation, so as to produce a composite RF signal, said composite signal including said first and second RF signals.

24. The method of claim 23 which further includes shaping the subcarrier signal.

25. The method of claim 24 in which shaping the subcarrier signal includes differentiating the subcarrier signal.

26. The method of claim 23 which further includes controlling the phase of the subcarrier signal used to amplitude modulate said RF signal.

27. The method of claim 23 in which said frequency and amplitude modulating of said RF signal is performed with modulation indices of $\beta$ and m, respectively, and in which the method further includes controlling said modulation indices so that $\beta = m$, whereby one of two sidebands produced by the frequency and amplitude modulating of said RF signal is cancelled.

28. An apparatus useful in measuring adjacent channel selectivity of a radio receiver under test comprising:
baseband modulation signal means for generating first and second baseband modulation signals;
summing means for summing the baseband modulation signals to produce a summed modulation signal;
offset oscillator means for producing an offset signal;
first modulation means for frequency modulating said offset signal with the summed modulation signal to yield a subcarrier signal;
level control means for controlling the level of the subcarrier signal;
RF oscillator means for producing an RF signal; and
second modulation means for amplitude modulating the RF signal with the subcarrier signal and additionally modulating the RF signal with both the subcarrier signal and the second baseband modulation signal using a form of modulation other than amplitude modulation, so as to produce a composite RF signal.

29. The apparatus of claim 28 which further includes means for controlling the phase of the subcarrier signal used to amplitude modulate said RF signal.

30. The apparatus of claim 28 in which said frequency and amplitude modulating of the RF signal is performed with modulation indices of $\beta$ and m, respectively, and in which the apparatus further includes means for controlling said modulation indices so that $\beta = m$, whereby one of two sidebands produced by the frequency and amplitude modulation of said RF signal is cancelled.

31. The apparatus of claim 28 which further comprises combiner means for combining the subcarrier signal with the second baseband modulation signal to yield a combined subcarrier signal, and in which the second modulation means comprises means for modulating said RF signal with the combined subcarrier signal using either frequency or phase modulation.

32. The apparatus of claim 31 which further includes shaping means for changing the amplitude of the combined subcarrier signal as a function of frequency.

33. A method of providing first and second RF signals to a radio receiver undergoing an adjacent channel selectivity measurement test, the method comprising the steps:
generating the first RF signal;
generating an offset signal;
modulating said first RF signal with the offset signal using both amplitude and narrow band frequency modulation with equal modulation indices of m and $\beta$, respectively, so a sideband produced by the amplitude modulation of the first RF signal cancels a sideband produced by the frequency modulation of the first RF signal, leaving another sideband produced by each type of modulation to sum constructively and serve as the second RF signal; and
providing said modulated first RF signal and said second RF signal to a radio receiver under test.

* * * * *